US009362040B2

(12) United States Patent
Rai et al.

(10) Patent No.: US 9,362,040 B2
(45) Date of Patent: Jun. 7, 2016

(54) COLDPLATE WITH INTEGRATED ELECTRICAL COMPONENTS FOR COOLING THEREOF

(71) Applicant: Lear Corporation, Southfield, MI (US)

(72) Inventors: Rutunj Rai, Canton, MI (US); Venkat Yalamanchili, Farmington Hills, MI (US); Parminder Brar, Windsor (CA); Michael Duco, Fraser, MI (US)

(73) Assignee: Lear Corporation, Southfield, MI (US)

( * ) Notice: Subject to any disclaimer, the term of this patent is extended or adjusted under 35 U.S.C. 154(b) by 114 days.

(21) Appl. No.: 14/288,857

(22) Filed: May 28, 2014

(65) Prior Publication Data

US 2015/0334874 A1    Nov. 19, 2015

Related U.S. Application Data

(60) Provisional application No. 61/993,767, filed on May 15, 2014.

(51) Int. Cl.
| | |
|---|---|
| *H01L 23/473* | (2006.01) |
| *G06F 1/20* | (2006.01) |
| *H05K 7/20* | (2006.01) |
| *H01F 27/08* | (2006.01) |

(52) U.S. Cl.
CPC ............ *H01F 27/08* (2013.01); *H05K 7/20254* (2013.01); *H05K 7/20854* (2013.01); *H01L 23/473* (2013.01); *Y10S 903/904* (2013.01)

(58) Field of Classification Search
CPC . H01L 23/473; H01L 23/367; H01L 23/4334; H01L 23/42; G06F 1/20; G06F 2200/201; G06F 1/203; G06F 1/206; H05K 7/20772; H05K 3/0061; H05K 7/20254; H05K 7/20781; H05K 7/20509; H05K 7/20927
USPC ............. 361/676, 677, 679.53, 698–703, 711
See application file for complete search history.

(56) References Cited

U.S. PATENT DOCUMENTS

| | | | |
|---|---|---|---|
| 3,604,082 | A | 9/1971 | McBrayer et al. |
| 3,622,846 | A | 11/1971 | Reimers |
| 3,656,035 | A | 4/1972 | Corman et al. |
| 4,628,407 | A | 12/1986 | August et al. |
| 4,670,814 | A | 6/1987 | Matsui et al. |
| 4,872,102 | A | 10/1989 | Getter |
| 5,091,823 | A | 2/1992 | Kanbara et al. |

(Continued)

FOREIGN PATENT DOCUMENTS

| | | |
|---|---|---|
| CN | 2742712 | 11/2005 |
| CN | 101606210 | 12/2009 |

(Continued)

*Primary Examiner* — Adam B Dravininkas
(74) *Attorney, Agent, or Firm* — Brooks Kushman P.C.

(57) ABSTRACT

A coldplate for use in cooling electrical components may include first and second coldplate members, each having a pocket and a secondary portion. The pocket of each member is configured to receive an electrical component and sized to substantially surround the component when received in the pocket to provide physical integration of the component in the coldplate member. The first and second coldplate members are adapted to be joined together to form a manifold therebetween for receiving a fluid for use in cooling the electrical components. The secondary portion of each coldplate member is arranged substantially opposite the pocket of the other coldplate member when the coldplate members are joined together.

20 Claims, 5 Drawing Sheets

(56) References Cited

U.S. PATENT DOCUMENTS

| | | |
|---|---|---|
| 5,239,443 A | 8/1993 | Fahey et al. |
| 5,367,437 A | 11/1994 | Anderson |
| 5,408,209 A | 4/1995 | Tanzer et al. |
| 5,469,124 A | 11/1995 | O'Donnell et al. |
| 5,498,030 A | 3/1996 | Hill et al. |
| 5,504,655 A | 4/1996 | Underwood et al. |
| 5,634,262 A | 6/1997 | O'Donnell et al. |
| 5,740,015 A | 4/1998 | Donegan et al. |
| 5,749,597 A | 5/1998 | Saderholm |
| 5,940,263 A | 8/1999 | Jakoubovitch |
| 5,949,191 A | 9/1999 | Cassese et al. |
| 5,973,923 A | 10/1999 | Jitaru |
| 6,031,751 A | 2/2000 | Janko |
| 6,045,151 A | 4/2000 | Wu |
| 6,087,916 A | 7/2000 | Kutkut et al. |
| 6,144,276 A | 11/2000 | Booth |
| 6,201,701 B1 | 3/2001 | Linden et al. |
| 6,206,466 B1 | 3/2001 | Komatsu |
| 6,222,733 B1 | 4/2001 | Gammenthalr |
| 6,262,891 B1 | 7/2001 | Wickelmaier et al. |
| 6,313,991 B1 | 11/2001 | Nagashima et al. |
| 6,326,761 B1 | 12/2001 | Tareilus |
| 6,386,577 B1 | 5/2002 | Kan et al. |
| 6,430,024 B1 | 8/2002 | Gernert |
| 6,450,528 B1 | 9/2002 | Suezawa et al. |
| 6,466,441 B1 | 10/2002 | Suzuki |
| 6,529,394 B1 | 3/2003 | Joseph et al. |
| 6,819,561 B2 | 11/2004 | Nartzell et al. |
| 6,839,240 B2 | 1/2005 | Skofljanec et al. |
| 6,844,802 B2 | 1/2005 | Drummond et al. |
| 6,943,293 B1 | 9/2005 | Jeter et al. |
| 7,050,305 B2 | 5/2006 | Thorum |
| 7,109,681 B2 | 9/2006 | Baker et al. |
| 7,130,197 B2 | 10/2006 | Chin |
| 7,164,584 B2 | 1/2007 | Walz |
| 7,173,823 B1 | 2/2007 | Rinehart et al. |
| 7,204,299 B2 | 4/2007 | Bhatti et al. |
| 7,212,407 B2 | 5/2007 | Beihoff et al. |
| 7,236,368 B2 | 6/2007 | Maxwell et al. |
| 7,264,045 B2 | 9/2007 | Mehendale et al. |
| 7,289,329 B2 | 10/2007 | Chen et al. |
| 7,295,448 B2 | 11/2007 | Zhu |
| 7,375,287 B2 | 5/2008 | Rathmann |
| 7,375,974 B2 | 5/2008 | Kirigaya |
| 7,471,534 B2 | 12/2008 | Andersson et al. |
| 7,479,020 B2 | 1/2009 | Whitton |
| 7,554,817 B2 | 6/2009 | Nakakita et al. |
| 7,579,805 B2 | 8/2009 | Saito et al. |
| 7,588,074 B1 * | 9/2009 | White ............ E04H 7/30 165/166 |
| 7,646,606 B2 | 1/2010 | Rytka et al. |
| 7,660,099 B2 | 2/2010 | Imamura et al. |
| 7,710,723 B2 | 5/2010 | Korich et al. |
| 7,726,440 B2 | 6/2010 | Aisenbrey |
| 7,742,303 B2 | 6/2010 | Azuma et al. |
| 7,788,801 B2 * | 9/2010 | Oggioni ............ G06F 21/87 29/830 |
| 7,791,887 B2 | 9/2010 | Ganev et al. |
| 7,798,833 B2 | 9/2010 | Holbrook |
| 7,800,257 B2 | 9/2010 | Lu |
| 7,804,688 B2 | 9/2010 | Wakabayashi et al. |
| 7,864,506 B2 | 1/2011 | Pal et al. |
| 7,869,714 B2 | 1/2011 | Patel et al. |
| 7,907,385 B2 | 3/2011 | Korich et al. |
| 7,920,039 B2 | 4/2011 | Shabany et al. |
| 7,952,225 B2 | 5/2011 | Reichard et al. |
| 7,952,876 B2 | 5/2011 | Azuma et al. |
| 7,957,166 B2 | 6/2011 | Schnetzka et al. |
| 7,974,101 B2 | 7/2011 | Azuma et al. |
| 8,040,005 B2 | 10/2011 | Bhatti |
| 8,064,198 B2 | 11/2011 | Higashidani et al. |
| 8,064,234 B2 | 11/2011 | Tokuyama et al. |
| 8,072,758 B2 | 12/2011 | Groppo et al. |
| 8,098,479 B1 | 1/2012 | Parler, Jr. et al. |
| 8,110,415 B2 | 2/2012 | Knickerbocker et al. |
| 8,169,780 B2 | 5/2012 | Yoshino et al. |
| 8,376,069 B2 | 2/2013 | Nakatsu et al. |
| 8,416,574 B2 | 4/2013 | Tokuyama et al. |
| 8,422,230 B2 | 4/2013 | Aiba et al. |
| 8,582,291 B2 | 11/2013 | Nakasaka et al. |
| 8,582,294 B2 | 11/2013 | Guerin et al. |
| 8,654,527 B2 | 2/2014 | Wei et al. |
| 8,665,596 B2 | 3/2014 | Brereton |
| 8,675,364 B2 | 3/2014 | Tokuyama et al. |
| 2002/0106414 A1 | 8/2002 | Gernert |
| 2002/0130495 A1 | 9/2002 | Lotspih et al. |
| 2003/0053298 A1 | 3/2003 | Yamada et al. |
| 2005/0263273 A1 | 12/2005 | Crumly |
| 2007/0240867 A1 | 10/2007 | Amano et al. |
| 2007/0246191 A1 | 10/2007 | Behrens et al. |
| 2008/0117602 A1 | 5/2008 | Korich et al. |
| 2009/0223647 A1 * | 9/2009 | Alousi ............ F28D 15/0233 165/80.3 |
| 2010/0078807 A1 | 4/2010 | Schulz |
| 2010/0081191 A1 | 4/2010 | Woods |
| 2010/0128437 A1 * | 5/2010 | Groppo ............ H05K 7/20927 361/703 |
| 2010/0157640 A1 | 6/2010 | Azuma et al. |
| 2010/0254093 A1 | 10/2010 | Oota et al. |
| 2010/0328883 A1 | 12/2010 | Ledezma et al. |
| 2010/0328893 A1 | 12/2010 | Higashidani et al. |
| 2011/0116235 A1 | 5/2011 | Ryu et al. |
| 2011/0214629 A1 | 9/2011 | Benoit |
| 2011/0222240 A1 | 9/2011 | Kawata et al. |
| 2011/0235276 A1 | 9/2011 | Hentschel et al. |
| 2011/0267778 A1 | 11/2011 | Eckstein et al. |
| 2011/0292615 A1 * | 12/2011 | Rai ............ H05K 1/0204 361/721 |
| 2012/0031598 A1 | 2/2012 | Han et al. |
| 2012/0206950 A1 | 8/2012 | Duppong et al. |
| 2012/0235290 A1 | 9/2012 | Morelle et al. |
| 2013/0039009 A1 | 2/2013 | Shin et al. |
| 2013/0044434 A1 | 2/2013 | Sharaf et al. |
| 2013/0170269 A1 | 7/2013 | Sharaf et al. |
| 2013/0215573 A1 | 8/2013 | Wagner et al. |
| 2013/0223009 A1 | 8/2013 | Nakatsu et al. |
| 2013/0258596 A1 * | 10/2013 | Sharaf ............ H05K 7/20927 361/702 |
| 2014/0069615 A1 | 3/2014 | Kusaka |

FOREIGN PATENT DOCUMENTS

| | | |
|---|---|---|
| CN | 101981638 | 2/2011 |
| CN | 102013319 | 4/2011 |
| DE | 102007054618 A1 | 6/2008 |
| DE | 102008033473 A1 | 5/2009 |
| EP | 1028439 | 8/2000 |
| EP | 1484774 | 12/2004 |
| FR | 2903057 | 1/2008 |
| JP | 4256397 | 9/1992 |
| JP | 07297043 | 11/1995 |
| JP | 200454358 A | 9/2004 |
| JP | 2007273774 | 10/2007 |
| JP | 2008078350 | 4/2008 |
| JP | 2008085168 | 4/2008 |
| JP | 2011182500 A | 9/2011 |
| WO | 2010144399 | 12/2010 |
| WO | 2011138156 | 11/2011 |

* cited by examiner

COLDPLATE WITH INTEGRATED ELECTRICAL COMPONENTS FOR COOLING THEREOF

CROSS-REFERENCE TO RELATED APPLICATIONS

This application claims the benefit of U.S. provisional application Ser. No. 61/993,767 filed May 15, 2014, the disclosure of which is hereby incorporated in its entirety by reference herein.

TECHNICAL FIELD

The following relates to a coldplate for use in an electric vehicle (EV) or a hybrid electric vehicle (HEV), the coldplate adapted to integrate electrical components to facilitate cooling thereof.

BACKGROUND

An automotive vehicle powered fully or partially by an electric motor may be referred to as an electric vehicle (EV) or a hybrid electric vehicle (HEV). As is well known in the art, such vehicles include a high-voltage (HV) battery or batteries for supplying power to the electric motors thereof.

Such electric vehicles typically provide for charging such HV batteries using a battery charger module mounted on-board the vehicle. The on-board battery charger module, which may include power factor correction, is provided in communication with the vehicle HV batteries and is configured to rectify AC electrical power from an electrical utility power grid for storage by the vehicle HV batteries. Such electric vehicles also include an inverter for use in converting DC voltage provided by the vehicle batteries to an AC voltage for use in powering the electric motor or motors of the vehicle. In addition, such electric vehicles may also include an auxiliary power module. These devices and modules may comprise a number of electrical components, which may include transformers, inductors, capacitors, bus bars, transistors and other components.

These electrical components generate heat as a result of their operations. The heat generated as a result of such operations should be dissipated so that the components, devices or modules may continue to operate efficiently. Such heat generated by the operation of these components may be dissipated using a coldplate provided as part of the device or module.

However, due to the heat generated as a result particularly of the operation of electrical components such as transformers, inductors or other magnetic components used in such electric vehicles, there exists a need for in improved coldplate providing for dissipation of electrical component generated heat beyond that of standard coldplates currently in use. Such a coldplate would include a pocket sized to substantially surround such an electrical component when received in the pocket to provide physical integration of the electrical component in the coldplate in order to facilite dissipation of the heat generated by operation of the component.

SUMMARY

According to one of the embodiments described herein, a coldplate for use in cooling electrical components is provided. The coldplate comprises a first coldplate member comprising a pocket configured to receive a first electrical component, the pocket of the first coldplate member sized to substantially surround the first electrical component when received in the pocket of the first coldplate member to provide physical integration of the first electrical component in the first coldplate member. The coldplate further comprises a second coldplate member. The first coldplate member and the second coldplate member are adapted to be joined together to form a manifold therebetween for receiving a fluid for use in cooling the electrical component.

According to another embodiment described herein, a coldplate is provided for use in cooling electrical components. The coldplate comprises a first coldplate member comprising a pocket and a secondary portion, the pocket of the first coldplate member configured to receive a first electrical component and sized to substantially surround the first electrical component when received in the pocket of the first coldplate member to provide physical integration of the first electrical component in the first coldplate member. The coldplate further comprises a second coldplate member comprising a pocket and a secondary portion, the pocket of the second coldplate member configured to receive a second electrical component and sized to substantially surround the second electrical component when received in the pocket of the second coldplate member to provide physical integration of the second electrical component in the second coldplate member.

The first coldplate member and the second coldplate member are adapted to be joined together to form a manifold therebetween for receiving a fluid for use in cooling the first and second electrical components, the secondary portion of the first coldplate member arranged substantially opposite the pocket of the second coldplate member and the secondary portion of the second coldplate member arranged substantially opposite the pocket of the first coldplate member when the first and second coldplate members are joined together.

According to another embodiment described herein, a coldplate for use in cooling electrical components is provided. The coldplate comprises a first coldplate member comprising a substantially planar portion and an at least partially cylindrical pocket configured to receive a plurality of first magnetic devices and sized to substantially surround the first magnetic devices when received in the pocket of the first coldplate member to provide physical integration of the first magnetic devices in the first coldplate member. The coldplate further comprises a second coldplate member comprising a substantially planar portion and a pocket having a substantially rectangular prism shape, the pocket of the second coldplate member configured to receive a plurality of second magnetic devices and sized to substantially surround the second magnetic devices when received in the pocket of the second coldplate member to provide physical integration of the second magnetic devices the second coldplate member.

The first coldplate member and the second coldplate member are adapted to be joined together to form a manifold therebetween for receiving a fluid for use in cooling the first and second magnetic devices, the substantially planar portion of the first coldplate member arranged substantially opposite the pocket of the second coldplate member and the substantially planar portion of the second coldplate member arranged substantially opposite the pocket of the first coldplate member when the first and second coldplate members are joined together.

A detailed description of these and other embodiments of a coldplate for use in cooling electrical components is set forth below together with the accompanying drawings.

DETAILED DESCRIPTION

As required, detailed embodiments are disclosed herein. However, it is to be understood that the disclosed embodiments are merely exemplary and may take various and alternative forms. The figures are not necessarily to scale. Features may be exaggerated or minimized to show details of particular components. Therefore, specific structural and functional details disclosed herein are not to be interpreted as limiting, but merely as a representative basis for teaching one skilled in the art.

With reference to FIGS. 1-9, a more detailed description of embodiments of a coldplate for use in cooling electrical components will be described. For ease of illustration and to facilitate understanding, like reference numerals have been used herein for like components and features throughout the drawings.

As previously described, an electric vehicle (EV) or hybrid electric vehicle (HEV) typically provide for charging high-voltage (HV) batteries on-board the vehicle using a battery charger module. The on-board battery charger module, which may include power factor correction, is provided in communication with the vehicle HV batteries and is configured to rectify AC electrical power from an electrical utility power grid for storage by the vehicle HV batteries. Such electric vehicles also include an inverter for use in converting DC voltage provided by the vehicle batteries to an AC voltage for use in powering the electric motor or motors of the vehicle. In addition, such electric vehicles may also include an auxiliary power module. These devices and modules may comprise a number of electrical components, which may include transformers, inductors, capacitors, bus bars, transistors and other components.

These electrical components generate heat as a result of their operations. The heat generated as a result of such operations should be dissipated so that the components, devices or modules may continue to operate efficiently. Such heat generated by the operation of these components may be dissipated using a coldplate provided as part of the device or module.

However, due to the heat generated as a result particularly of the operation of electrical components such as transformers, inductors or other magnetic components used in such electric vehicles, there exists a need for in improved coldplate providing for dissipation of electrical component generated heat beyond that of standard coldplates currently in use. Such a coldplate would include a pocket sized to substantially surround such an electrical component when received in the pocket to provide physical integration of the electrical component in the coldplate in order to facilite dissipation of the heat generated by operation of the component.

Figure 1:
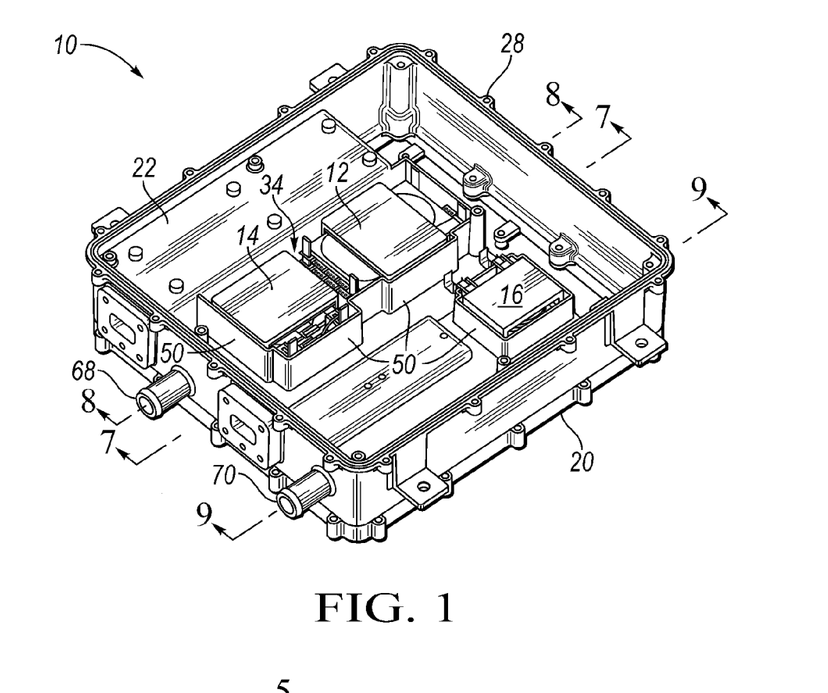
FIG. 1 is a perspective view of a coldplate for use with an EV or HEV on-board charger module, as seen from one side of the coldplate.
Figure 2:
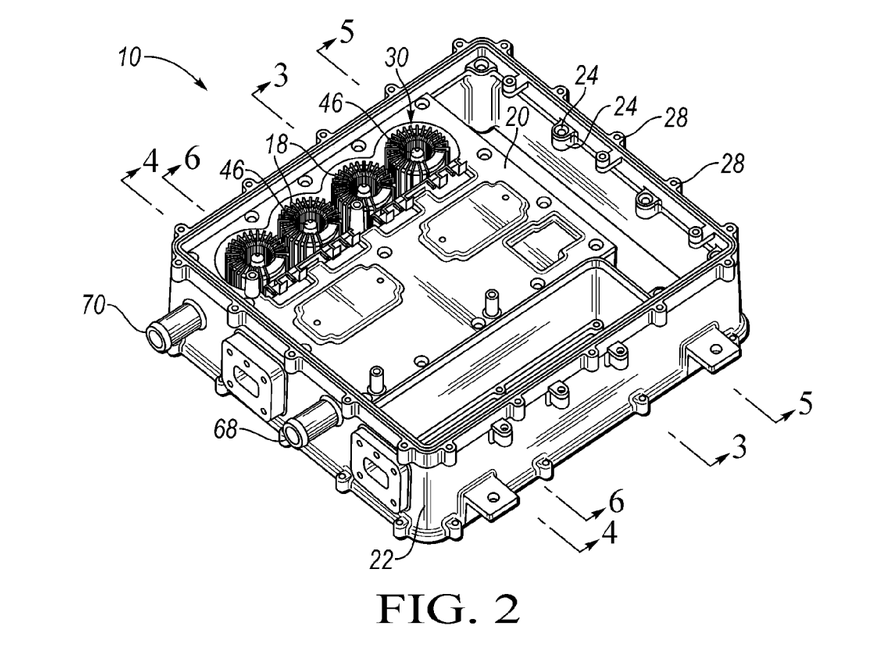
FIG. 2 is another perspective view of the coldplate of FIG. 1, as seen from the opposite side of the coldplate.

Referring now to FIGS. 1 and 2, perspective views of a coldplate 10 are shown. The coldplate 10 may be for use in cooling electrical components for use in an on-board battery charger module or other devices or modules in an electric vehicle (EV) or hybrid electric vehicle (HEV). Such electrical components, which may comprise any type of electronic, electrical or magnetic component or device, may include a main transformer 12, filter inductor 14, resonant inductor 16 and power factor correction (PFC) inductors 18. As seen in FIGS. 1 and 2, coldplate 10 may comprise a first coldplate member 20 and a second coldplate member 22. First and second coldplate members 20, 22 may be adapted to be joined together to form the coldplate 10. In that regard, the first and second coldplate members 20, 22 may each comprise attachment features 24 having holes formed therein for use with fasteners (not shown) to join first and second coldplate members 20, 22 together.

The first and second coldplate members 20, 22 may also be adapted for attachment to one or more printed circuit boards (PCB) 26 including further electrical components (see FIGS. 3-9). In that regard, the first and second coldplate members 20, 22 may still further be adapted for attachment to one or more electrical connector housings 62, and may comprise attachment features 64 having holes formed therein for use with fasteners (not shown) to attach connector housings 62 to the first and/or second coldplate members 20, 22 (see FIGS. 8 and 9). Attachment features 64 may further be provided with an opening therein to enable electrical conductors (not shown) to pass through walls of the first and/or second coldplate members 20, 22 in order to make electrical connections with PCBs 26 and/or electrical components 12, 14, 16, 18 or other electrical components. In that regard, PCBs 26 are shown as transparent in FIGS. 3-5, 8 and 9 to facilitate showing other components and/or features therein. First and second coldplate members 20, 22 may further be adapted for attachment to one or more covers 66, and may comprise attachment features 28 having holes formed therein for use with fasteners (not shown) to attach covers 66 to the first and/or second coldplate members 20, 22 (see FIGS. 6 and 7).

Figure 7:
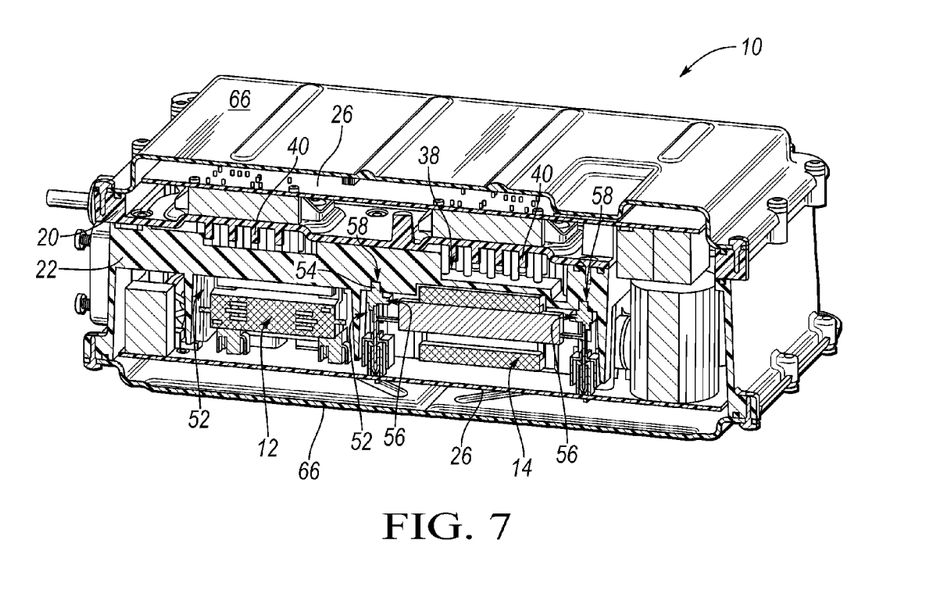
FIG. 7 is a cross-sectional view of the coldplate of FIG. 1, taken along the line 7-7 shown therein.
Figure 8:
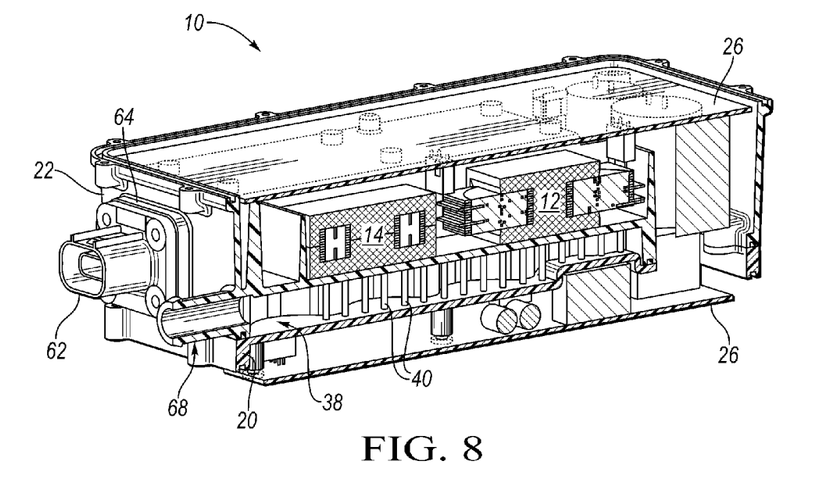
FIG. 8 is another cross-sectional view of the coldplate of FIG. 1, taken along the line 8-8 shown therein.
Figure 9:
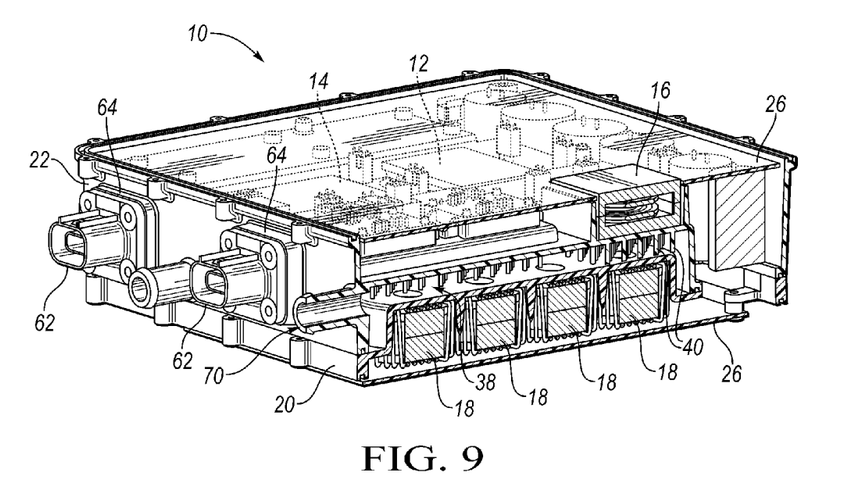
FIG. 9 is another cross-sectional view of the coldplate of FIG. 1, taken along the line 9-9 shown therein.

FIGS. 3-6 depict cross-sectional views of the coldplate 10 of FIG. 2, where the cross-sectional views of FIGS. 3, 4, 5 and 6 are taken along the lines 3-3, 4-4, 5-5 and 6-6, respectively, shown in FIG. 2. Similarly, FIGS. 7-9 depict cross-sectional views of the coldplate 10 of FIG. 1, where the cross-sectional views of FIGS. 7, 8 and 9 are taken along the lines 7-7, 8-8 and 9-9, respectively, shown in FIG. 1.

Referring now to FIGS. 3-9, and with continuing reference to FIGS. 1 and 2, a coldplate 10 is illustrated for use in cooling electrical components 12, 14, 16, 18, 26 and/or other electrical components. The coldplate 10 comprises first and second coldplate members 20, 22. The first coldplate member 20 may comprise a pocket 30 and a secondary portion 32, which may be substantially planar. The pocket 30 of the first coldplate member 20 may be configured to receive a first electrical component 18 and may be sized to substantially surround the first electrical component 18 when received in the pocket 30 of the first coldplate member 20 to provide physical integration of the first electrical component 18 in the first coldplate member 20.

The second coldplate member 22 may similarly comprise a pocket 34 and a secondary portion 36, which may be substantially planar. The pocket 34 of the second coldplate member 22 may be configured to receive a second electrical component 12, 14, 16 and may be sized to substantially surround the second electrical component 12, 14, 16 when received in the pocket 34 of the second coldplate member 22 to provide physical integration of the second electrical component 12, 14, 16 in the second coldplate member 22.

The first coldplate member 20 and the second coldplate 22 member may be adapted to be joined together to form a chamber or manifold 38 therebetween for receiving a fluid (not shown) for use in cooling the first and second electrical components 12, 14, 16, 18. One or both of the first and second coldplate members 20, 22 may also comprise a plurality of fins 40 configured to extend into the manifold 38 to provide one or both of first and second coldplate members 20, 22 with a greater surface area for exposure to fluid flow in order to further facilitate cooling of the electrical components 12, 14, 16, 18. In that regard, first and second coldplate members 20, 22 may comprise any material known in the art for use in facilitating such cooling, such as a metal. Similarly, the fluid to be circulated through the manifold 38 may comprise any material known in the art for use in facilitating such cooling, such as water. In that regard, first and/or second coldplate members 20, 22 may comprise a fluid inlet 68 and a fluid outlet 70 for use in circulating a fluid through the manifold 38 to facilitate cooling of electrical components 12, 14, 16, 18, 26 or other electrical components.

Figure 3:
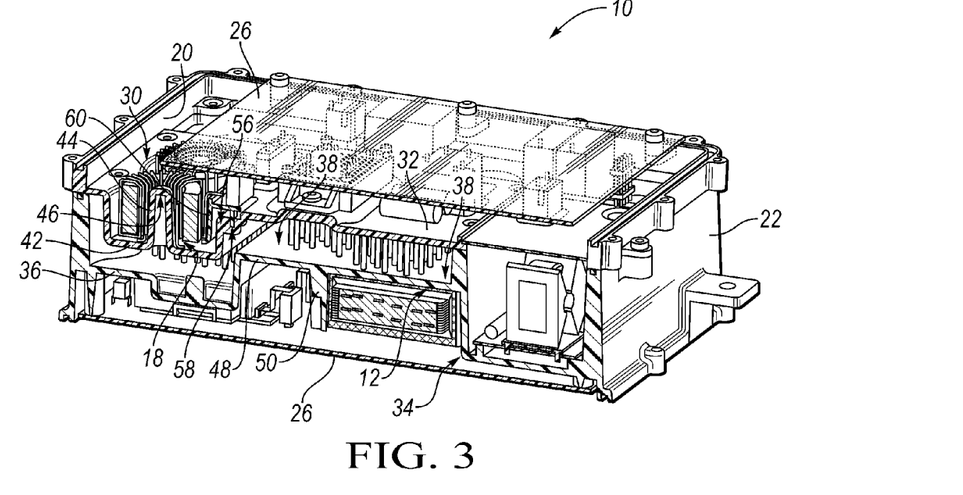
FIG. 3 is a cross-sectional view of the coldplate of FIG. 2, taken along the line 3-3 shown therein.
Figure 4:
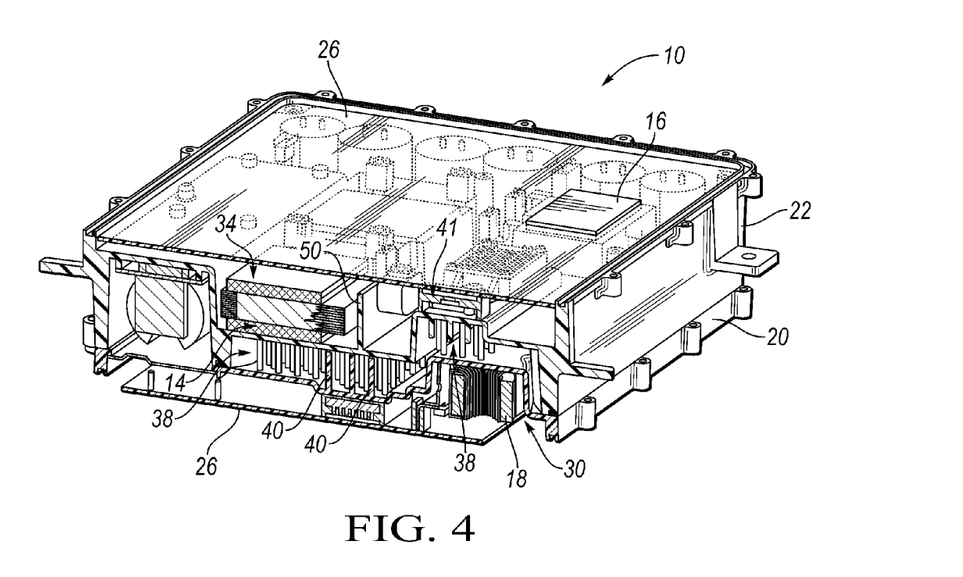
FIG. 4 is another cross-sectional view of the coldplate of FIG. 2, taken along the line 4-4 shown therein.
Figure 5:
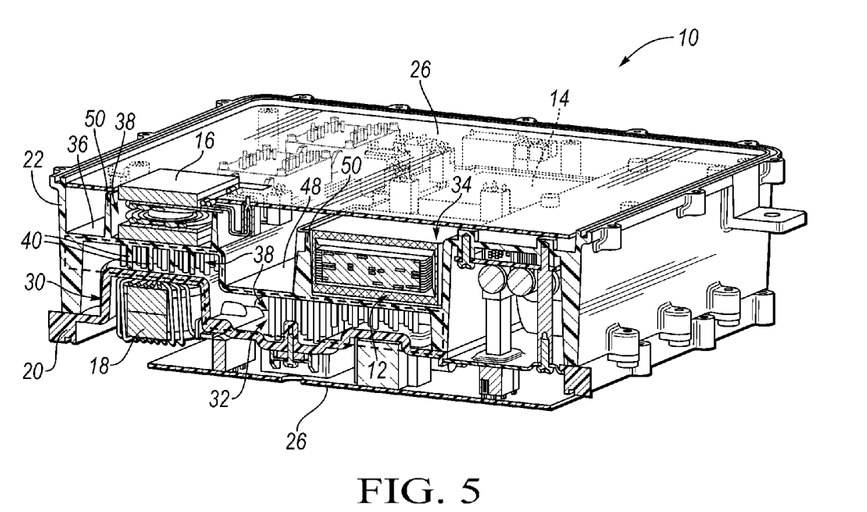
FIG. 5 is another cross-sectional view of the coldplate of FIG. 2, taken along the Line 5-5 shown therein.
Figure 6:
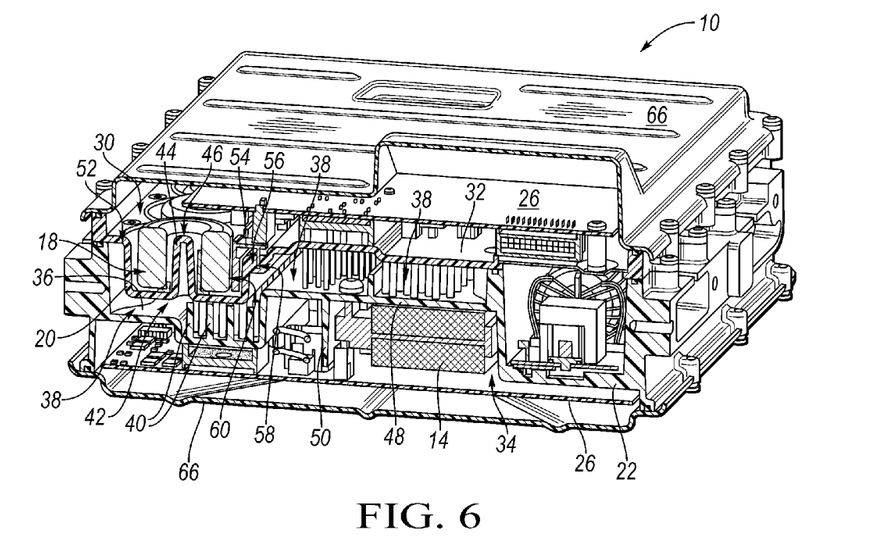
FIG. 6 is another cross-sectional view of the coldplate of FIG. 2, taken along the line 6-6 shown therein.

Referring particularly to FIGS. 3, 5 and 6, the secondary portion 32 of the first coldplate member 20 may be arranged substantially opposite the pocket 34 of the second coldplate member 22 when the first and second coldplate members 20, 22 are joined together. Similarly, the secondary portion 36 of the second coldplate member 22 may be arranged substantially opposite the pocket 30 of the first coldplate member 20 when the first and second coldplate members 20, 22 are joined together. A stepped relationship is thereby provided in the manifold 38 formed between the first and second coldplates 20, 22 (see dashed line in FIG. 5). In such a fashion, taller electrical components 18 mounted on the first coldplate member 20 (in pocket 30) on one side of the coldplate 10 are aligned with shorter electrical components, such as component 41, on second coldplate member 22 on the other side of the coldplate 10 when the first and second coldplate members are joined together. Similarly, taller electrical components 12, 14 mounted on the second coldplate member 22 (in pocket 34) on one side of the coldplate 10 are aligned with shorter components on first coldplate member 20 on the other side of the coldplate 10 when the first and second coldplate members are joined together.

Referring again to FIGS. 3-9, and with continuing reference to FIGS. 1 and 2, the pocket 30 of the first coldplate member 20 may be provided with a depth substantially equal to a height of the first electrical component 18. Similarly, the pocket 34 of the second coldplate member 22 may be provided with a depth substantially equal to a height of the second electrical components 12, 14, 16.

The pocket 30 of the first coldplate member 20 may have a floor 42 and one or more walls 44 extending from the floor 42 of the pocket 30 of the first coldplate member 20. A wall 44 may form a post 46 for receipt by an opening formed in the first electrical component 18 (e.g., the opening in the core of inductor 18) to align the first electrical component 18 in the pocket 30 of the first coldplate member 20. The pocket 34 of the second coldplate member 22 may have a floor 48 and one or more walls 50 extending from the floor 48 of the pocket 34 of the second coldplate member 22.

The pocket 30 of the first coldplate member 20 and/or the pocket 34 of the second coldplate member 22 may be further adapted to receive in spaces or gaps 52 between the components 12, 14, 16, 18 and the pockets 30, 34 a material such that the material substantially surrounds the electrical components 12, 14, 16, 18 when received in the pockets 30, 34 of the first and second coldplate members 20, 22. In that regard, such a material may provide heat transfer, electrical isolation and/or mechanical support to the electrical components 12, 14, 16, 18. The material received in spaces or gaps 52 may be any material known in the art suitable for any such purposes, such as a potting material. Such material and/or other features described herein (e.g., pockets 30, 34; posts 46; walls 44, 50) enable electrical components 12, 14, 16, 18 to be integrated into the coldplate members 20, 22 and mounted thereto without the use of separate housings and/or fasteners, thereby reducing costs associated with the coldplate 10 as well as improving cooling of such electrical components 12, 14, 16, 18.

As seen in FIGS. 1-7, the first and second coldplate members 20, 22 may each be provided with one or more pockets 30, 34. In that regard, a pocket 30 of the first coldplate member 20 may be at least partially cylindrical in shape or substantially cylindrical in shape. A pocket 34 of the second coldplate member 22 may have a shape of a substantially rectangular prism. While at least partially or substantially cylindrical shapes for pocket 30 and a substantially rectangular prism shape for pocket 34 have been shown and described, it should be noted that pockets 30, 34 may be provided with any known shape. In that regard, as previously described, pockets 30, 34 are sized to substantially surround the electrical components 12, 14, 16, 18 when received in the pockets 30, 34 of the first and second coldplate members 20, 22 to provide physical integration of the electrical components 12, 14, 16, 18 in the first and second coldplate members 20, 22.

With particular reference to FIGS. 3, 6 and 7, the coldplate 10 may further comprise one or more alignment apparatuses 54, each having an attachment feature 56. The first and/or second coldplate members 20, 22 may further comprise one or more attachment features 58, each configured to cooperate with an attachment feature 56 of an alignment apparatus 54. In that regard, attachment features 56, 58 may comprise complementary holes/slots and posts/tabs formed in apparatus 54 and first and/or second coldplate members 20, 22. In such a fashion, when attached to the first and/or second coldplate members 20, 22, an alignment apparatus 54 aligns at least one of the electrical components 12, 14, 16, 18 in a pocket 30, 34 of the first and/or second coldplate members 20, 22 when an electrical component 12, 14, 16, 18 is received in the pocket 30, 34 of the first and/or second coldplate members 20, 22. An alignment apparatus 54 may comprise an extension 60 configured to extend into the pocket 30 of the first coldplate member 20 into the space or gap 52 between the electrical component 18 and the pocket 30 to thereby facilitate alignment of the electrical component 18 in the pocket 30 of the first coldplate member. Alignment apparatus 54 may comprise any known electrically isolating material, such as a plastic material.

As is readily apparent from the foregoing, embodiments of a coldplate for use in cooling electrical components have been described. Such embodiments include a coldplate comprising a pocket sized to substantially surround such an electrical component when received in the pocket to provide physical integration of the electrical component in the coldplate in order to facilite dissipation of the heat generated by operation of the component.

While various embodiments of a coldplate for use in cooling electrical components have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A coldplate for use in cooling electrical components, the coldplate comprising:
   a first coldplate member comprising a pocket and a secondary portion, the pocket of the first coldplate configured to receive a first electrical component and sized to substantially surround the first electrical component when received in the pocket of the first coldplate member; and
   a second coldplate member comprising a pocket and a secondary portion, the pocket of the second coldplate member configured to receive a second electrical component and sized to substantially surround the second electrical component when received in the pocket of the second coldplate member;
   wherein the first coldplate member and the second coldplate member are adapted to be joined together to form a manifold therebetween for receiving a fluid for use in cooling the first and second electrical components, the secondary portion of the first coldplate member arranged substantially opposite the pocket of the second coldplate member and the secondary portion of the second coldplate member arranged substantially opposite the pocket of the first coldplate member when the first and second coldplate member are joined together.

2. The coldplate of claim 1 wherein the pocket of the first coldplate member has a depth substantially equal to a height of the first electrical component.

3. The coldplate of claim 1 wherein the pocket of the first coldplate member is substantially cylindrical.

4. The coldplate of claim 1 wherein the pocket of the first coldplate member has a substantially rectangular prism shape.

5. The coldplate of claim 1 wherein the pocket of the first coldplate member has a floor and a wall extending from the floor of the pocket of the first coldplate member.

6. A coldplate for use in cooling electrical components, the coldplate comprising:
   a first coldplate member comprising a pocket and a secondary portion, the pocket of the first coldplate member configured to receive a first electrical component and sized to substantially surround the first electrical component when received in the pocket of the first coldplate member to provide physical integration of the first electrical component in the first coldplate member; and
   a second coldplate member comprising a pocket and a secondary portion, the pocket of the second coldplate member configured to receive a second electrical component and sized to substantially surround the second electrical component when received in the pocket of the second coldplate member to provide physical integration of the second electrical component in the second coldplate member;
   wherein the first coldplate member and the second coldplate member are adapted to be joined together to form a manifold therebetween for receiving a fluid for use in cooling the first and second electrical components, the secondary portion of the first coldplate member arranged substantially opposite the pocket of the second coldplate member and the secondary portion of the second coldplate member arranged substantially opposite the pocket of the first coldplate member when the first and second coldplate members are joined together.

7. The coldplate of claim 6 wherein the pocket of the first coldplate member has a depth substantially equal to a height of the first electrical component and the pocket of the second coldplate member has a depth substantially equal to a height of the second electrical component.

8. The coldplate of claim 6 wherein the pocket of the first coldplate member has a floor and a wall extending from the floor of the pocket of the first coldplate member, the wall forming a post for receipt by an opening formed in the first electrical component to align the first electrical component in the pocket of the first coldplate member.

9. The coldplate of claim 6 wherein the pocket of the second coldplate member has a floor and a wall extending from the floor of the pocket of the second coldplate member.

10. The coldplate of claim 6 wherein the pocket of the first coldplate member is further adapted to receive a material such that the material substantially surrounds the first electrical component when received in the pocket of the first coldplate member.

11. The coldplate of claim 10 wherein the material provides heat transfer, electrical isolation and mechanical support to the first electrical component.

12. The coldplate of claim 6 wherein the first electrical component comprises a magnetic device.

13. The coldplate of claim 12 wherein the magnetic device comprises a transformer or an inductor.

14. A coldplate for use in cooling electrical components, the coldplate comprising:
   a first coldplate member comprising a substantially planar portion and an at least partially cylindrical pocket configured to receive a plurality of first magnetic devices and sized to substantially surround the first magnetic devices when received in the pocket of the first coldplate member to provide physical integration of the first magnetic devices in the first coldplate member; and
   a second coldplate member comprising a substantially planar portion and a pocket having a substantially rectangular prism shape, the pocket of the second coldplate member configured to receive a plurality of second magnetic devices and sized to substantially surround the second magnetic devices when received in the pocket of the second coldplate member to provide physical integration of the second magnetic devices in the second coldplate member;
   wherein the first coldplate member and the second coldplate member are adapted to be joined together to form a manifold therebetween for receiving a fluid for use in cooling the first and second magnetic devices, the substantially planar portion of the first coldplate member arranged substantially opposite the pocket of the second coldplate member and the substantially planar portion of the second coldplate member arranged substantially opposite the pocket of the first coldplate member when the first and second coldplate members are joined together.

15. The coldplate of claim 14 wherein the pocket of the first coldplate member is sized to substantially surround the first magnetic devices when received in the pocket of the first coldplate member to provide physical integration of the first magnetic devices in the first coldplate member absent mechanical connectors for connecting the first magnetic devices to the first coldplate member.

16. The coldplate of claim 14 wherein the pocket of the first coldplate member has a depth substantially equal to a height of the first magnetic devices and the pocket of the second coldplate member has a depth substantially equal to a height of the second magnetic devices.

17. The coldplate of claim 14 wherein the pocket of the first coldplate member has a floor and a plurality of walls extending from the floor of the pocket of the first coldplate member, each of the plurality of walls forming a post for receipt by an opening formed in a first magnetic device to align the first magnetic devices in the pocket of the first coldplate member.

18. The coldplate of claim 14 wherein the pocket of the first coldplate member is further adapted to receive a material such that the material substantially surrounds the first magnetic devices when received in the pocket of the first coldplate member.

19. The coldplate of claim 18 wherein the material provides heat transfer, electrical isolation and mechanical support to the first magnetic devices.

20. The coldplate of claim 14 further comprising an alignment apparatus having an attachment feature, wherein the first coldplate member further comprises an attachment feature configured to cooperate with the attachment feature of the alignment apparatus so that, when attached to the first coldplate member, the alignment apparatus aligns at least one of the first magnetic devices in the pocket of the first coldplate member when the first magnetic devices are received in the pocket of the first coldplate member.

* * * * *